(12) United States Patent
Droopad et al.

(10) Patent No.: US 6,270,568 B1
(45) Date of Patent: Aug. 7, 2001

(54) METHOD FOR FABRICATING A SEMICONDUCTOR STRUCTURE WITH REDUCED LEAKAGE CURRENT DENSITY

(75) Inventors: Ravindranath Droopad, Chandler; Zhiyi Yu; Jamal Ramdani, both of Gilbert, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/354,173

(22) Filed: Jul. 15, 1999

(51) Int. Cl.⁷ .................................................. C30B 1/00
(52) U.S. Cl. ........................ 117/4; 117/103; 117/108; 117/947
(58) Field of Search ............................... 117/4, 3, 84, 88, 117/103, 108, 947

(56) References Cited

U.S. PATENT DOCUMENTS

| | | | |
|---|---|---|---|
| 4,888,202 | * 12/1989 | Murakami et al. | 427/42 |
| 5,225,031 | * 7/1993 | McKee et al. | 156/612 |
| 5,393,352 | * 2/1995 | Summerfelt | 148/33.3 |
| 5,450,812 | * 9/1995 | McKee et al. | 117/84 |
| 5,473,171 | * 12/1995 | Summerfelt | 257/183 |
| 5,482,003 | * 1/1996 | McKee et al. | 117/108 |
| 5,589,284 | * 12/1996 | Summerfelt | 428/697 |
| 5,650,646 | * 7/1997 | Summerfelt | 257/295 |
| 6,088,216 | * 7/2000 | Laibowitz et al. | 361/321.4 |
| 6,090,659 | * 7/2000 | Laibowitz et al. | 438/240 |

FOREIGN PATENT DOCUMENTS

| | | | |
|---|---|---|---|
| WO-93/12542 | * 6/1993 | (WO) | H01L/7/115 |
| WO-00/01868 | * 1/2000 | (WO) | C30B/0/02 |

* cited by examiner

*Primary Examiner*—Felisa Hiteshew
*Assistant Examiner*—Matthew Anderson
(74) *Attorney, Agent, or Firm*—William E. Koch

(57) ABSTRACT

A method for fabricating a semiconductor structure including the steps of providing a silicon substrate (10) having a surface (12); forming an interface including a seed layer (18) adjacent to the surface (12) of the silicon substrate (10), forming a buffer layer (20) utilizing molecular oxygen; and forming one or more layers of a high dielectric constant oxide (22) on the buffer layer (20) utilizing activated oxygen.

18 Claims, 2 Drawing Sheets

METHOD FOR FABRICATING A SEMICONDUCTOR STRUCTURE WITH REDUCED LEAKAGE CURRENT DENSITY

FIELD OF INVENTION

The present invention relates in general to a method for fabricating a semiconductor structure including a buffer layer between a silicon substrate and metal oxides, and more particularly to a method for fabricating a semiconductor structure including a buffer layer and a high dielectric constant oxide formed using activated oxygen to reduce leakage current density.

BACKGROUND OF THE INVENTION

Epitaxial growth of single crystal oxide thin films on silicon is of great interest in numerous device applications, e.g., ferroelectrics or high dielectric constant oxides for non-volatile high density memory and next generation MOS devices. Also, in the preparation of these films, it is pivotal to establish an ordered transition layer or buffer layer on the Si surface, especially for subsequent growth of single crystal oxides, e.g., perovskites.

Some reported growth of these oxides, such as BaO and $BaTiO_3$ on Si (100) were based on a $BaSi_2$ (cubic) template by depositing one fourth monolayer of Ba on Si (100) using molecular beam epitaxy at temperatures greater than 850° C. See for example: R. McKee et al., *Appl. Phys. Lett.* 59(7), pp. 782–784 (Aug. 12 1991); R. McKee et al., *Appl. Phys. Lett.* 63(20), pp. 2818–2820 (Nov. 15 1993); R. McKee et al., *Mat. Res. Soc. Symp. Proc.*, Vol. 21, pp. 131–135 (1991); U.S. Pat. No. 5,225,031, issued July 6, 1993, entitled "PROCESS FOR DEPOSITING AN OXIDE EPITAXIALLY ONTO A SILICON SUBSTRATE AND STRUCTURES PREPARED WITH THE PROCESS"; and U.S. Pat. No. 5,482,003, issued Jan. 9, 1996, entitled "PROCESS FOR DEPOSITING EPITAXIAL ALKALINE EARTH OXIDE ONTO A SUBSTRATE AND STRUCTURES PREPARED WITH THE PROCESS". A strontium silicide ($SrSi_2$) interface model with a c(4×2) structure was proposed. See for example: R. McKee et al., *Phys. Rev. Lett.* 81(14), 3014 (Oct. 5 1998). However, atomic level simulation of this proposed structure indicates that it likely is not stable at elevated temperatures.

Growth of $SrTiO_3$ on silicon (100) using an SrO buffer layer has been accomplished. See for example: T. Tambo et al., *Jpn. J. Appl. Phys.*, Vol. 37 (1998), pp. 4454–4459. However, the SrO buffer layer was thick (100 Å), thereby limiting application for transistor films, and crystallinity was not maintained throughout the growth.

Furthermore, $SrTiO_3$ has been grown on silicon using thick oxide layers (60–120 Å) of SrO or TiO. See for example: B. K. Moon et al., *Jpn. J. Appl. Phys.*, Vol. 33 (1994), pp. 1472–1477. These thick buffer layers would limit the application for transistors.

In CMOS applications, these types of oxide layers are fabricated using molecular oxygen and are formed thin (less than 50 Å). Accordingly, a result is leaky films in which high electrical leakage is experienced due to oxygen deficiencies or vacancies. Furthermore, these films require a post growth anneal in oxygen to reduce leakage current density across the oxide layer.

Therefore, a method for fabricating a high dielectric constant oxide on a semiconductor structure having low leakage current density is desired.

It is a purpose of the present invention to provide for a method of fabricating a high dielectric constant oxide on a semiconductor structure having low leakage current density.

It is a further purpose of the present invention to provide for a method of fabricating a high dielectric constant oxide on a semiconductor structure in which the gate dielectric leakage current density is near zero.

It is another purpose of the present invention to provide for a method of fabricating a high dielectric constant oxide on a semiconductor structure using activated or atomic oxygen, thus reducing leakage current density.

SUMMARY OF THE INVENTION

The above problems and others are at least partially solved and the above purposes and others are realized in a method of fabricating a semiconductor structure including the steps of providing a silicon substrate having a surface, forming on the surface of the silicon substrate a buffer layer comprising a crystalline material formed using molecular oxygen and forming one or more layers of a high dielectric constant oxide on the buffer layer using activated oxygen.

BRIEF DESCRIPTION OF THE DRAWINGS

Referring to the Drawings

DETAILED DESCRIPTION OF THE PREFERRED EMBODIMENT

This disclosure teaches a method of fabricating a high dielectric constant (high-k) metal oxide having an interface with a silicon substrate. The process is based on the fabrication of a high dielectric constant oxide layer utilizing activated oxygen. In addition, the process includes the fabrication of a buffer layer as an interface for subsequent growth of the high dielectric constant oxide layer using molecular oxygen. Accordingly, disclosed is a new method of growing perovskite oxides such as $SrTiO_3$, $BaTiO_3$, $SrBaTiO_3$, $CaTiO_3$, or the like utilizing activated oxygen.

To form the novel interface between a silicon (Si) substrate and one or more layers of a high dielectric constant (high-k) metal oxide(s), various approaches may be used. Included are examples for starting with a Si substrate having silicon dioxide ($SiO_2$) on the surface. The silicon dioxide is disclosed as formed of a native oxide, or utilizing thermal, or chemical techniques. $SiO_2$ is amorphous rather than single crystalline which is desirable for purposes of growing additional single crystal material on the substrate.

Figure 1:
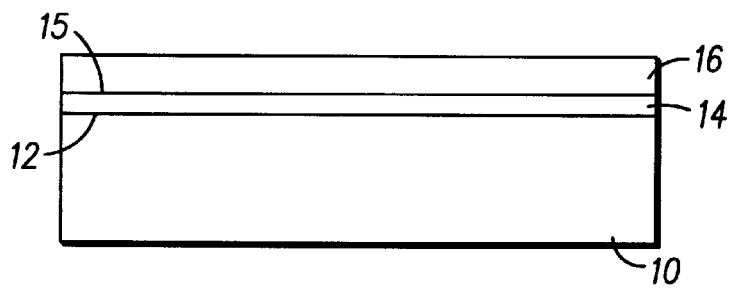
FIG. 1 illustrates a cross-sectional view of a clean semiconductor substrate having a native oxide layer and an oxide layer formed thereon in accordance with the present invention.

Turning now to the drawings in which like elements are designated with like numbers throughout the FIGS., FIG. 1 illustrates a Si substrate 10 having a surface 12, and an optional layer 14 of $SiO_2$ thereupon. In this particular embodiment, layer 14 of $SiO_2$ naturally exists (native oxide)

once the silicon substrate 10 is exposed to air (oxygen). Alternatively, layer 14 of $SiO_2$ may be formed purposely in a controlled fashion well known in the art, e.g., thermally by applying oxygen onto the surface 12 at a high temperature, or chemically using a standard chemical etch process. In an alternative embodiment, layer 14 of $SiO_2$ is removed utilizing thermal desorption of the native oxide, or the like. In this particular embodiment, layer 14 is formed with a thickness in a range of 5–100 Å thick, and more particularly with a thickness in a range of 10–25 Å.

Figure 2:
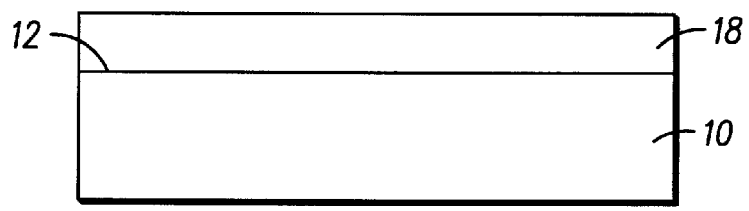
FIG. 2 illustrates a cross-sectional view of the semiconductor structure having a seed layer formed thereon in accordance with the present invention.

Next, a thin (e.g few mono-layers) seed layer 18 (as illustrated in FIG. 2) of a silicate nature or the like is formed using either the process of metal reaction with the $SiO_2$ or a metal oxide such as SrO, BaO or the like, to the surface 15 of $SiO_2$ layer 14 at 0–900° C. and under oxygen partial pressure equal to or less than $1\times10^{-4}$ mBar. This can be accomplished in a molecular beam epitaxy chamber or in a chemical vapor deposition (CVD) or a physical vapor deposition (PVD) chamber under inert ambient conditions.

To fabricate seed layer 18, substrate 10 is properly heated and substrate 10 having $SiO_2$ layer 14 thereon is exposed to a beam of metal, such as strontium (Sr), barium (Ba), calcium (Ca), zirconium (Zr), hafnium (Hf), or the like to react with the $SiO_2$ layer, or to a metal oxide compound such as SrO, BaO or the like utilizing molecular oxygen to form an amorphous oxide 16 onto the $SiO_2$ oxide 14 as illustrated in FIG. 1.

This step provides for the formation of a stable silicate on silicon substrate 10. The next step is the formation of a high-k oxide layer using molecular oxygen only, this layer is of low resistivity but will serve as a barrier layer thus limiting the oxygen diffusion to the silicon substrate thus limiting the seed layer thickness to few monolayers. During fabrication the thickness of metal oxide layer 16 buffer layer is 5–100 Å, with a preferred thickness in the range of 15–50 Å. This oxide layer is crystalline.

In this particular embodiment, the insertion of a buffer layer between the seed layer and the final oxide layer is crucial in maintaining thin interface seed layer 18. During fabrication, this growth is monitored using reflection high energy electron diffraction (RHEED) techniques which are well documented in the art and which can be used in situ, i.e., while performing the exposing step within the growth chamber. It will of course be understood that once a specific manufacturing process is provided and followed, it may not be necessary to perform the RHEED techniques on every substrate. Alternatively, monitoring of the crystalline structure can be accomplished utilizing any surface sensitive technique, such as reflection difference spectroscopy (RDS), spectroscopic ellipsometry (SE), or the like wherein the surface is monitored by in situ techniques.

It should be understood by those skilled in the art that the temperatures and pressures given for these processes are recommended for the particular embodiment described, but the invention is not limited to a particular temperature or pressure range. As taught, seed layer 18 comprises rows of strontium, silicon, and oxygen atoms in a 2×1 configuration on a (001) surface of silicon substrate 10, 1x in the <110> direction and 2x in the orthogonal <110> direction.

Figure 3:
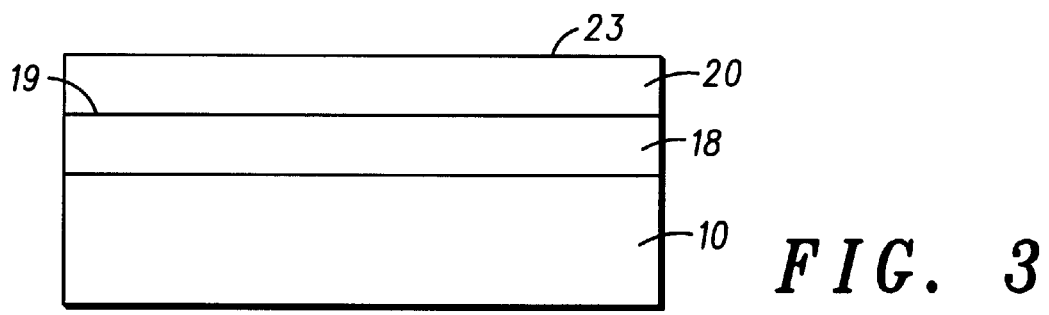
FIG. 3 is a cross-sectional view of the semiconductor substrate of FIG. 2 further showing a buffer layer formed thereon in accordance with the present invention.

Next, a buffer layer 20 is formed on a surface 19 of seed layer 18. Buffer layer 20 is formed by exposing the structure to a beam of metal, such as strontium (Sr), barium (Ba), calcium (Ca), zirconium (Zr), hafnium (Hf), or the like utilizing molecular oxygen to form an oxide onto the seed layer 18 as illustrated in FIG. 3. Buffer layer 20 serves to smooth the surface of seed layer 18 for the subsequent growth of a high dielectric constant oxide (discussed presently). Buffer layer also serves to preserve the structure of seed layer 18. Buffer layer 20 is formed to a thickness in a range of 0–100 Å. As taught, buffer layer 20 is crystalline.

Figure 4:
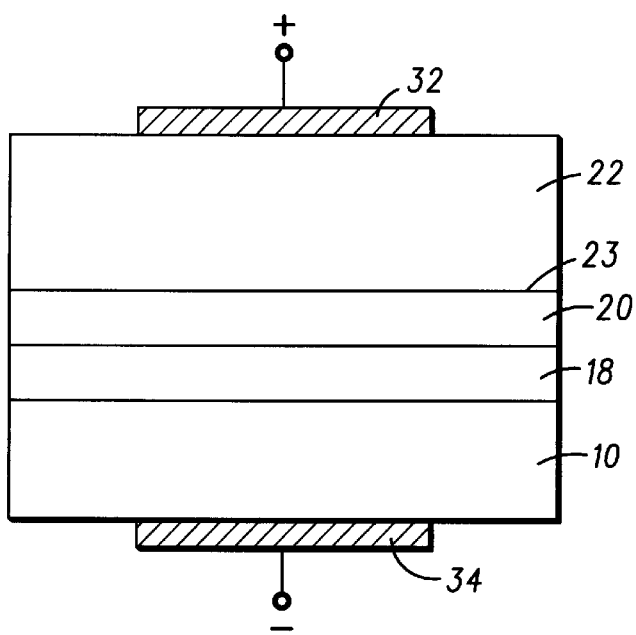
FIG. 4 is a cross-sectional view of the semiconductor substrate of FIG. 3 further showing a high dielectric constant oxide layer and metal contacts for measuring leakage current density across the structure in accordance with the present invention.

Next, the formation of a high dielectric constant oxide layer 22, as illustrated in FIG. 4, is accomplished by either the simultaneous or alternating supply to a surface 23 of the buffer layer 20 of an alkaline-earth metal and a transition metal at less than or equal to 800° C., more particularly at a temperature in a range of 350–650° C. and under a partial pressure of less than or equal to $1\times10^{-4}$ mBar of activated oxygen.

Single crystal high dielectric constant oxide layer 22, more particularly a perovskite, is formed on surface 23 of buffer layer 20 by either the simultaneous or alternating supply of alkaline-earth metal (Sr, Ba etc), activated oxygen, more particularly atomic oxygen, and a transition metal, such as titanium, at less than or equal to 800° C. under an activated oxygen partial pressure of less than or equal to $1\times10^{-4}$ mBar. This single crystal oxide layer 22 may, for example, comprise a thickness of 50–1000 Å and will be substantially lattice matched with the underlying buffer layer 20.

Figure 5:
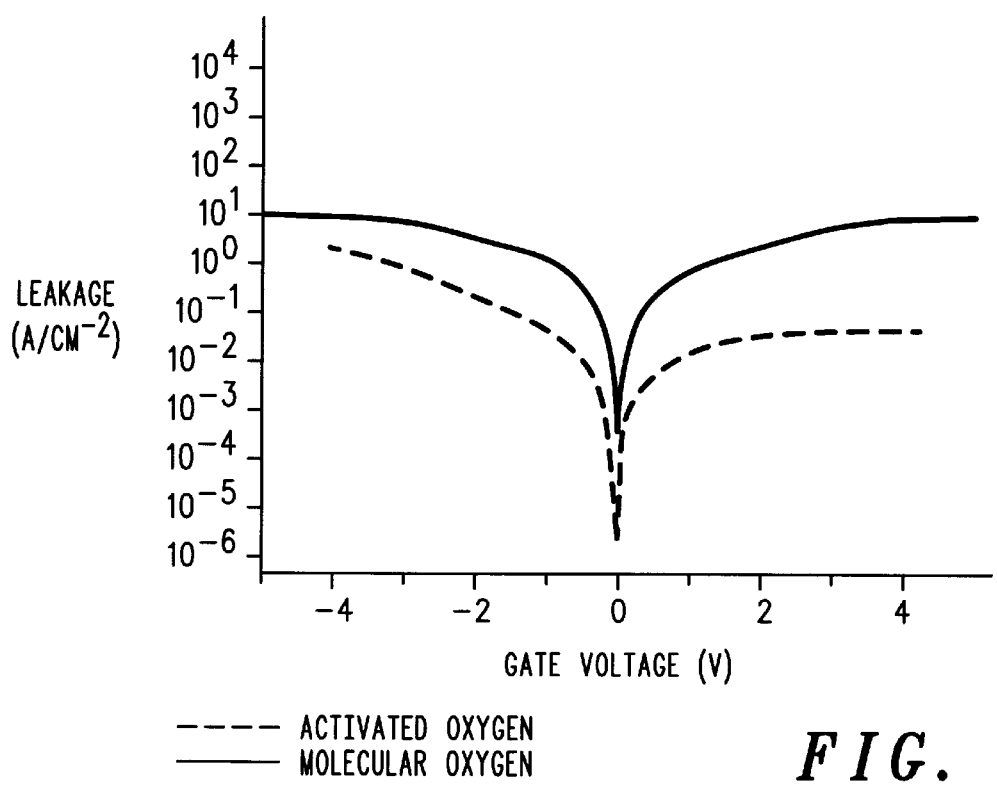
FIG. 5 illustrates graphically the reduction of leakage current density across the structure of FIG. 4 in accordance with the present invention.

Referring to FIGS. 4 and 5, high dielectric constant layer 22 when formed in this manner utilizing activated oxygen exhibits a decrease in current leakage of two orders of magnitude, for example $10^{-2}$ $A/cm^2$ at −1V, than that of oxide layers grown with molecular oxygen. Illustrated in FIG. 4, is a device structure 30 fabricated according to the inventive method disclosed herein. More particularly, illustrated is device 30 including substrate 10, seed layer 18, buffer layer 20, and high dielectric constant oxide layer 22. Further included, are a positive metal contact 32 and a negative metal contact 34. Leakage current density is measured across structure of device 30 and resultant values are illustrated graphically in FIG. 5. As illustrated, leakage current density across device structure 30 is decreased due to the utilization of activated oxygen to form the semiconductor structure. Illustrated comparatively in FIG. 5 are layers formed with molecular oxygen and layers formed with activated oxygen according to the present invention.

As disclosed, this method can be used to grow additional oxide layers of the $ABO_3$ structure, e.g. $SrTiO_3$, $BaTiO_3$, $CaTiO_3$, $(Ba, Sr)TiO_3$, or the like. In addition, this method can be used in a variety of growth deposition methods, including, but not limited to molecular beam epitaxy (MBE), chemical beam epitaxy (CBE), metal-organic molecular beam epitaxy (MOMBE), ultra-high vacuum chemical vapor deposition (UHVCVD), physical vapor deposition (PVD), metal-organic chemical vapor deposition (MOCVD), or the like.

Accordingly, disclosed is a method for fabricating a high dielectric constant oxide layer 22 for decreased leakage current density in combination with silicon substrate 10 as described herein. The interface of buffer layer, 20 is formed utilizing molecular oxygen. The high dielectric constant oxide layer 22 is formed utilizing activated oxygen, thereby providing for reduced leakage current density. Activated or atomic oxygen is utilized during the growth step of the oxide layer 22, generated using an RF plasma source, an electron cyclotron resonance (ECR), ozone gas, or the like. This method of fabrication provides for reduced leakage current density across the oxide layer 22, thus as a result, processing steps and thermal budgets for CMOS applications are considerably reduced. It should be understood that this method as disclosed can be applied for the growth of a variety of oxide layers in a number of deposition processes.

What is claimed is:

1. A method of fabricating a semiconductor structure comprising the steps of:

provatypeding a silicon substrate having a surface;

forming on the surface of the substrate a single crystal buffer layer utilizing molecular oxygen; and forming one or more layers of a single crystal high dielectric constant oxide on the buffer layer utilizing activated oxygen.

2. The method of fabricating a semiconductor structure of claim 1 further including the step of forming on the surface of the silicon substrate, between the silicon substrate and the single crystal buffer layer, a seed layer comprising a silicate crystalline material.

3. The method of fabricating a semiconductor structure of claim 2 wherein the forming the seed layer step includes forming a 2×1 reconstruction.

4. The method of fabricating a semiconductor structure of claim 2 wherein the step of forming a seed layer includes forming the seed layer in one of a UHV environment, a chemical vapor deposition system or a physical vapor deposition system.

5. The method of fabricating a semiconductor structure of claim 2 wherein the step of forming a seed layer comprises forming at least a single monolayer of silicon, oxygen, and a metal.

6. The method of fabricating a semiconductor structure of claim 2 wherein the step of forming a seed layer further comprises the steps of:

forming a silicon oxide layer having a surface;

depositing a metal on the surface of the silicon oxide layer; and heating to convert substantially all the silicon oxide layer and the metal to form a silicate crystalline material seed layer.

7. The method of fabricating a semiconductor structure of claim 6 wherein the metal is selected from the group of strontium, barium, calcium, zirconium, and hafnium.

8. The method of fabricating a semiconductor structure of claim 1 wherein the step of forming a single crystal buffer layer utilizing molecular oxygen includes forming the single crystal buffer layer of a metal oxide selected from the group of strontium and molecular oxygen, barium and molecular oxygen, calcium and molecular oxygen, zirconium and molecular oxygen and hafnium and molecular oxygen.

9. The method of fabricating a semiconductor structure of claim 1 wherein the step of forming one or more layers of a single crystal high dielectric constant oxide on the buffer layer utilizing activated oxygen includes forming the single crystal high dielectric constant oxide with activated oxygen, a transition metal selected from the group of titanium, zirconium, and hafnium, and a metal selected from the group of strontium, barium, and calcium.

10. A method of fabricating a semiconductor structure comprising the steps of:

providing a silicon substrate having a surface;

forming amorphous silicon dioxide on the surface of the silicon substrate;

providing a metal on the amorphous silicon dioxide;

heating the semiconductor structure to substantially convert the amorphous silicon dioxide and metal to form an interface comprising a crystaline seed layer adjacent the surface of the silicon substrate;

forming a single crystal buffer layer utilizing molecular oxygen on a surface of the seed layer; and forming at least one layer of a single crystal high dielectric constant oxide utilizing activated oxygen on a surface of the buffer layer.

11. The method of fabricating a semiconductor structure of claim 10 wherein the forming the crystaline seed layer step includes forming a 2×1 reconstruction.

12. The method of fabricating a semiconductor structure of claim 10 wherein the step of forming a crystalline seed layer includes forming the crystaline seed layer in one of a UHV environment, a chemical vapor deposition system or a physical vapor deposition system.

13. The method of fabricating a semiconductor structure of claim 10 wherein the step of forming a crystaline seed layer comprises forming at least a single monolayer of silicon, oxygen, and a metal.

14. The method of fabricating a semiconductor structure of claim 13 wherein the metal is selected from the group of strontium, barium, calcium, zirconium, and hafnium.

15. The method of fabricating a semiconductor structure of claim 10 wherein the step of forming a single crystal buffer layer utilizing molecular oxygen includes forming the single crystal buffer layer of a metal oxide selected from the group of strontium and molecular oxygen, barium and molecular oxygen, calcium and molecular oxygen, zirconium and molecular oxygen and hafnium and molecular oxygen.

16. The method of fabricating a semiconductor structure of claim 10 wherein the step of forming at least one layer of a single crystal high dielectric constant oxide on the single crystal buffer layer utilizing activated oxygen includes forming the single crystal high dielectric constant oxide with activated oxygen, a transition metal selected from the group of titanium, zirconium, and hafnium, and a metal selected from the group of strontium, barium, and calcium.

17. A method of fabricating a semiconductor structure comprising the steps of:

providing a silicon substrate having a surface;

forming a single crystal seed layer adjacent the surface of the silicon substrate;

forming a single crystal buffer layer utilizing molecular oxygen on a surface of the single crystal seed layer, the single crystal buffer layer formed of a metal oxide and molecular oxygen; and forming a single crystal high dielectric constant oxide utilizing activated oxygen on a surface of the single crystal buffer layer, the single crystal high dielectric constant oxide formed of a metal oxide and activated oxygen.

18. The method of fabricating a semiconductor structure of claim 17 wherein the metal oxide used in forming the single crystal buffer layer and the single crystal high dielectric oxide layer are selected from the group of barium and oxygen, strontium and oxygen, calcium and oxygen, zirconium and oxygen and hafnium and oxygen.

* * * * *